(12) United States Patent
Cheng et al.

(10) Patent No.: US 11,094,766 B2
(45) Date of Patent: Aug. 17, 2021

(54) ARRAY SUBSTRATE, DISPLAY PANEL, AND DISPLAY DEVICE

(71) Applicant: BOE TECHNOLOGY GROUP CO., LTD., Beijing (CN)

(72) Inventors: Hongfei Cheng, Beijing (CN); Yuxin Zhang, Beijing (CN); Xueguang Hao, Beijing (CN); Yongda Ma, Beijing (CN); Yongchun Lu, Beijing (CN); Hui Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 85 days.

(21) Appl. No.: 16/475,335

(22) PCT Filed: Oct. 24, 2018

(86) PCT No.: PCT/CN2018/111631
§ 371 (c)(1),
(2) Date: Jul. 1, 2019

(87) PCT Pub. No.: WO2019/184321
PCT Pub. Date: Oct. 3, 2019

(65) Prior Publication Data
US 2020/0227498 A1 Jul. 16, 2020

(30) Foreign Application Priority Data

Mar. 28, 2018 (CN) .......................... 201820433213.7

(51) Int. Cl.
*H01L 27/32* (2006.01)
*H01L 49/02* (2006.01)
*H01L 27/12* (2006.01)

(52) U.S. Cl.
CPC ...... *H01L 27/3265* (2013.01); *H01L 27/3248* (2013.01); *H01L 27/3258* (2013.01);
(Continued)

(58) Field of Classification Search
CPC .................. H01L 27/3265; H01L 27/3248
See application file for complete search history.

(56) References Cited

U.S. PATENT DOCUMENTS

2008/0246042 A1 * 10/2008 Ting ........................ H01L 27/124
257/89
2009/0267075 A1 10/2009 Wang et al.
(Continued)

FOREIGN PATENT DOCUMENTS

CN 101924122 A 12/2010
CN 103107182 A 5/2013
(Continued)

OTHER PUBLICATIONS

Office Action of KR Application No. 1020197015432 and English translation, dated Apr. 1, 2020, 10 pages.

*Primary Examiner* — Jay C Chang
*Assistant Examiner* — Mikka Liu
(74) *Attorney, Agent, or Firm* — Muncy, Geissler, Olds and Lowe, P.C.

(57) ABSTRACT

An array substrate, a display panel and a display device are provided. The array substrate includes a plurality of pixel units, wherein each pixel unit includes a storage capacitor including at least three electrode plates parallel to each other, the at least three electrode plates parallel to each other include a first electrode plate, a second electrode plate and a third electrode plate, the first electrode plate is electrically connected to the second electrode plate, the third electrode plate is disposed between the first electrode plate and the second electrode plate, and the first electrode plate and the second electrode plate each have a portion facing towards the third electrode plate.

11 Claims, 6 Drawing Sheets

(52) U.S. Cl.
CPC ...... *H01L 27/3262* (2013.01); *H01L 27/3276* (2013.01); *H01L 28/60* (2013.01); *H01L 27/124* (2013.01); *H01L 27/1248* (2013.01); *H01L 27/1255* (2013.01)

(56) References Cited

U.S. PATENT DOCUMENTS

| | | |
|---|---|---|
| 2013/0119388 A1 | 5/2013 | Lee et al. |
| 2014/0291636 A1* | 10/2014 | Kim .................. H01L 27/1225 257/40 |
| 2015/0179724 A1 | 6/2015 | Lee et al. |
| 2015/0214249 A1 | 7/2015 | Cheng et al. |
| 2016/0247837 A1 | 8/2016 | Shi et al. |
| 2016/0322449 A1* | 11/2016 | Pyon .................. H01L 27/3262 |

FOREIGN PATENT DOCUMENTS

| | | |
|---|---|---|
| CN | 103208506 A | 7/2013 |
| CN | 103730450 A | 4/2014 |
| CN | 104064688 A | 9/2014 |
| CN | 104078486 A | 10/2014 |
| CN | 104701314 A | 6/2015 |
| CN | 207909879 U | 9/2018 |
| KR | 20140117041 A | 10/2014 |
| KR | 20150073611 A | 7/2015 |
| KR | 20160075461 A | 6/2016 |

* cited by examiner

US 11,094,766 B2

ARRAY SUBSTRATE, DISPLAY PANEL, AND DISPLAY DEVICE

CROSS-REFERENCE TO RELATED APPLICATION

This application is the U.S. national phase of PCT Application No. PCT/CN2018/111631 filed on Oct. 24, 2018, which claims priority to Chinese Patent Application No. 201820433213.7 filed on Mar. 28, 2018, the contents of which are incorporated herein in their entirety by reference.

TECHNICAL FIELD

The present disclosure relates to the field of display technology, and, for example, in particular to an array substrate, a display panel and a display device.

BACKGROUND

Organic Light Emitting Diode (OLED) display devices and Quantum dots Light-emitting Diode (QLED) display devices are self-luminous display devices, and these self-luminous display devices include pixel electrodes which are used as an anode, a common electrode which is a cathode, and a light emitting layer provided between the pixel electrodes and the common electrode. The light emitting layer is capable of emitting light when an appropriate voltage is applied between the anode and the cathode.

SUMMARY

An array substrate includes a plurality of pixel units, wherein each pixel unit includes a storage capacitor including at least three electrode plates parallel to each other, the at least three electrode plates parallel to each other include at least a first electrode plate, a second electrode plate and a third electrode plate, the first electrode plate is electrically connected to the second electrode plate, the third electrode plate is disposed between the first electrode plate and the second electrode plate, and the first electrode plate and the second electrode plate each have a portion facing towards the third electrode plate.

In some embodiments, the portion facing towards the third electrode plate of at least one of the first electrode plate and the second electrode is bent toward a direction of the third electrode plate.

In some embodiments, the at least three electrode plates parallel to each other further include a fourth electrode plate, the fourth electrode plate is electrically connected to the first electrode plate and is disposed between the first electrode plate and the third electrode plate, and the fourth electrode plate has a portion facing towards the third electrode plate.

In some embodiments, each pixel unit includes in turn an active layer, a gate insulation layer, a gate electrode of a first thin film transistor (TFT), an interlayer insulation layer, a source electrode and a drain electrode of the first TFT which are disposed in a same layer, a passivation layer, and a pixel electrode on a base substrate;

the drain electrode of the first TFT is electrically connected to the pixel electrode through a first via hole penetrating the passivation layer; the active layer is integrated with the first electrode plate; and the pixel electrode is integrated with the second electrode plate.

In some embodiments, in the array substrate, the third electrode plate and the drain electrode of the first TFT are disposed in a same layer.

In some embodiments, in the array substrate, the third electrode plate is electrically connected to the gate electrode of the first TFT through a second via hole penetrating the interlayer insulation layer.

In some embodiments, the array substrate further includes a second TFT, a data line, and a gate line, wherein a source electrode of the second TFT is connected to the data line, a gate electrode of the second TFT is connected to the gate line, and the source electrode of the second TFT, a drain electrode of the second TFT, the source electrode of the first TFT, and the drain electrode of the first TFT are disposed in a same layer, the gate electrode of the second TFT and the gate electrode of the first TFT are disposed in a same layer; wherein the drain electrode of the second TFT is electrically connected to the gate electrode of the first TFT through a third via hole penetrating the interlayer insulation layer.

In some embodiments, the at least three electrode plates parallel to each other further include a fourth electrode plate which is electrically connected to the first electrode plate and has a portion facing towards the third electrode plate, the fourth electrode plate and the gate electrode of the first TFT are disposed in a same layer.

In some embodiments, the fourth electrode plate is electrically connected to the first electrode plate through a fourth via hole penetrating the gate insulation layer.

In some embodiments, a planarization layer is provided between the passivation layer and the pixel electrode, a recess is provided in a portion of the planarization layer facing towards the third electrode plate, the second electrode plate is deposited on the planarization layer and forms a bending part at the recess; and/or a protrusion is provided at a portion of the base substrate facing towards the third electrode plate, the first electrode plate is deposited on the substrate, and the first electrode plate forms a bending part at the protrusion.

In some embodiments, the array substrate further includes an anode, a cathode, and a light emitting layer provided between the anode and the cathode, wherein the pixel electrode is the anode, the light emitting layer is disposed at a side of each pixel unit, and the light emitting layer is an organic light emitting layer or a quantum dot light emitting layer.

A display panel includes any one of the above array substrate.

A display device includes any one of the above display panel.

DETAILED DESCRIPTION

Figure 1:
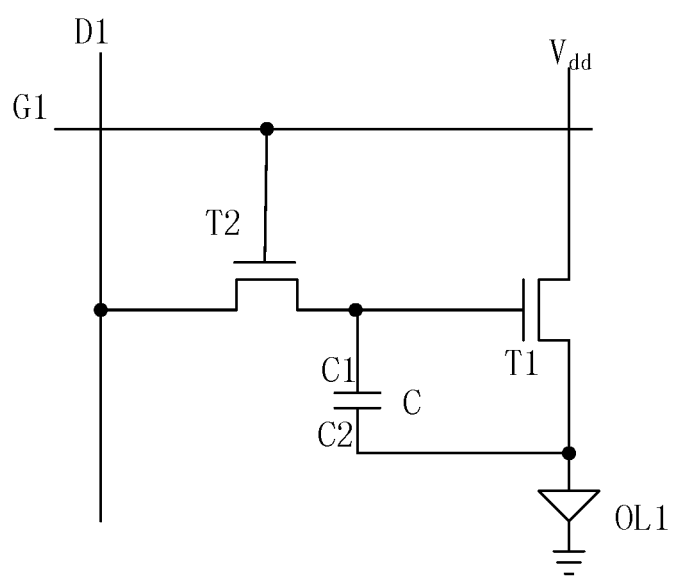
FIG. 1 is a structural diagram of a driving circuit of a pixel unit in an OLED display.

FIG. 1 is a structural diagram of a driving circuit of a pixel unit in an OLED display. As shown in FIG. 1, the driving circuit includes a thin film transistor (TFT) T1 provided for driving the OLED, a thin film transistor T2 provided for controlling switch of the OLED, and a storage capacitor C.

A gate electrode of the thin film transistor T2 (also referred to as the switch TFT) is connected to a gate line G1, a source electrode of the thin film transistor T2 is connected to a data line D1, and a drain electrode of the thin film transistor T2 is connected to a gate electrode of the thin film transistor T1 (also referred to as the driving TFT). A source electrode of the thin film transistor T1 is connected to a power source line $V_{dd}$, and a drain electrode of the thin film transistor T1 is connected to a pixel electrode (the anode of the organic light emitting diode (OLED) OL1). A first electrode C1 of the storage capacitor C is connected to the drain electrode of the thin film transistor T2 and the gate electrode of the thin film transistor T1, a second electrode C2 of the storage capacitor C is connected to the drain electrode of the thin film transistor T1 and the anode electrode of OL1.

In the driving circuit of the OLED display shown in FIG. 1, the larger the capacitance value of the storage capacitor C is, the greater by the influence of the leakage current of the thin film transistor T1 on the display image of the OLED display, and the more stable the image quality of the display image is. Therefore, increasing the capacitance value of the storage capacitor C becomes a method for improving the stability of the display image.

In order to increase the capacitance value of the storage capacitor C, it is usually necessary to increase the facing area of the two electrodes of the storage capacitor. However, under the condition that the display area (the area of the display region of the display panel) is limited, the capacitance value cannot be increased significantly through this method.

Some embodiments of the present disclosure provide an array substrate. The array substrate includes a plurality of pixel units, wherein each pixel unit has a storage capacitor provided thereon. The storage capacitor includes at least three electrode plates parallel to each other, the at least three electrode plates parallel to each other include a first electrode plate, a second electrode plate and a third electrode plate, wherein the first electrode plate is electrically connected to the second electrode plate, the third electrode plate is disposed between the first electrode plate and the second electrode plate, the first electrode plate has a portion facing towards the third electrode plate, and the second electrode plate has a portion facing towards the third electrode plate.

In the array substrate provided by the above embodiment, the storage capacitor of each pixel unit includes at least three electrode plates parallel to each other, the third electrode plate provided between the first electrode plate and the second electrode plate faces towards the first electrode plate and the second electrode plate, respectively, and thus forming the storage capacitor. Compared with the related art, the distance between the electrode plates is reduced, and the overall capacitance value of the storage capacitor is increased by increasing the number of electrode plates of the storage capacitor without increasing the area occupied by the storage capacitor.

Figure 2:
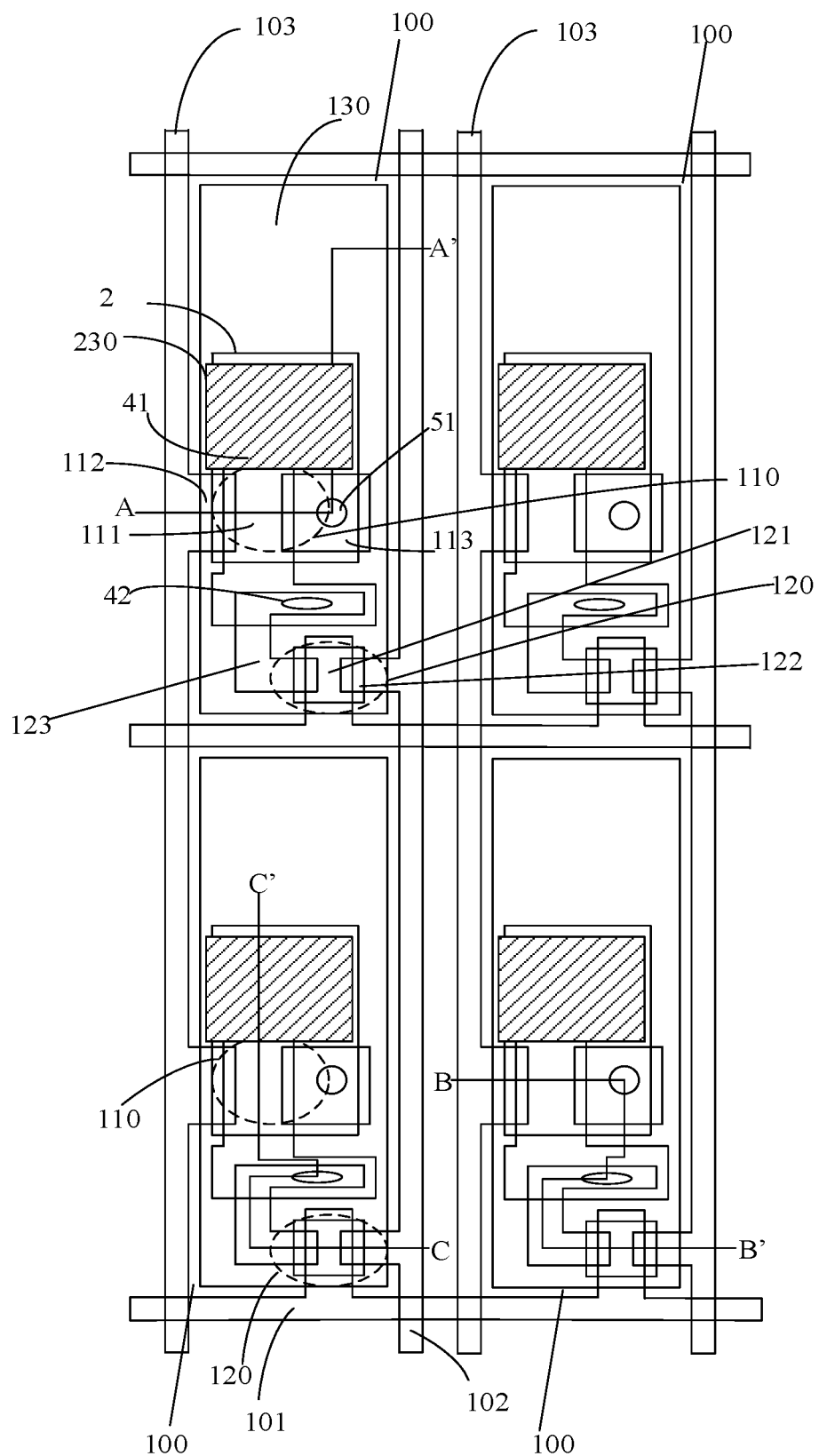
FIG. 2 is a schematic plan view of a structure of an array substrate provided by some embodiments.
Figure 3A:
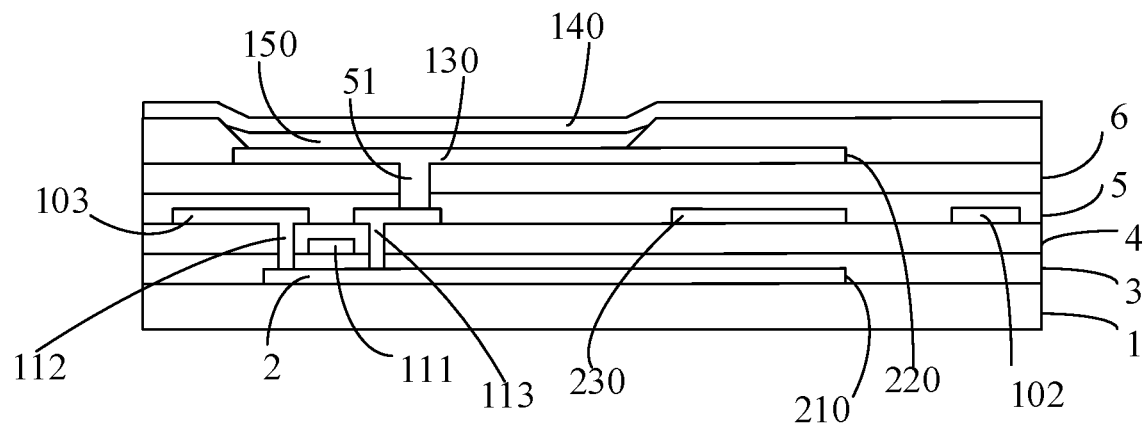
FIG. 3A is a sectional view of the array substrate taken along a line AA' in FIG. 2 provided by some embodiments.

FIG. 2 is a schematic plan view of a structure of an array substrate provided by some embodiments. FIG. 3A is a sectional view of the array substrate taken along a line AA' in FIG. 2 provided by some embodiments. Referring to FIGS. 2 and 3A, the array substrate includes a plurality of pixel units 100, each pixel unit 100 includes a first TFT 110, a second TFT 120, a pixel electrode 130 and a storage capacitor.

The array substrate applied in the OLED display is described in the following. As shown in FIG. 1, in the array substrate of the OLED display, the pixel electrode 130 is the anode of the OLED.

In some embodiments, referring to FIGS. 2 and 3A, and in conjunction with FIG. 1, the array substrate further includes gate lines 101, data lines 102 and power source lines ($V_{dd}$) 103. A gate electrode of the second TFT 120 is connected to the gate line 101, a source electrode of the second TFT 120 is connected to the data line 102, and a drain electrode of the second TFT 120 is connected to the gate electrode of the first TFT 110. A source electrode of the first TFT 110 is connected to $V_{dd}$ 103, and a drain electrode of the first TFT 110 is connected to the pixel electrode (i.e., the anode of the OLED) 130.

Referring to FIG. 3A, each pixel unit 100 including the above components in the array substrate is provided on a base substrate 1. Taking a partial cross section of the array substrate taken along the line AA' as an example, each pixel unit 100 includes an active layer 2, a gate insulation layer 3, the gate electrode 111 of the first TFT 110, an interlayer insulation layer 4, the source electrode 112 of the first TFT 110 (which is provided in a same layer as that of the drain electrode 113 of the first TFT 110), a passivation layer 5 and a pixel electrode 130 provided on the base substrate 1 in sequence.

In some embodiments, the base substrate 1 is a glass substrate.

In some embodiments, each pixel unit 100 further includes a storage capacitor. Referring to FIGS. 2 and 3A, the storage capacitor includes a first electrode plate 210, a second electrode plate 220 and a third electrode plate 230. The first electrode plate 210 is electrically connected to the second electrode plate 220, the third electrode plate 230 is disposed between the first electrode plate 210 and the second electrode plate 220, and the first electrode plate 210 and the second electrode plate 220 each have a portion facing towards the third electrode plate 230.

Compared with a storage capacitor having two electrode plates, the array substrate provided in the embodiment shown in FIGS. 2 and 3A has an increased number of electrode plates and a reduced distance between the electrode plates, and thereby the overall capacitance value of the storage capacitor is increased without increasing the area occupied by the storage capacitor.

In some embodiments, referring to FIG. 3A, the active layer 2 is integrated with the first electrode plate 210, and the pixel electrode 130 is integrated with the second electrode plate 220.

In some embodiments, the drain electrode 113 of the first TFT 110 is connected to the pixel electrode 130 through a first via hole 51 penetrating the passivation layer 5, and also connected to the active layer 2. Based on such structure, the first electrode plate 210 is connected to the drain electrode 113 of the first TFT 110, and the second electrode plate 220 is also connected to the drain electrode 113 of the first TFT 110, and thereby the first electrode plate 210 is electrically connected to the second electrode plate 220. The third electrode plate 230 is disposed between the first electrode plate 210 and the second electrode plate 220, and faces towards the first electrode plate 210 and the second electrode plate 220, respectively. Thus, a capacitor formed by the third electrode plate 230 and the first electrode plate 210 and a capacitor formed by the third electrode plate 230 and the second electrode plate 220 form two capacitors in parallel. The capacitance value of the two parallel capacitors is larger than a capacitance value of a storage capacitor formed by only two electrode plates.

In some embodiments, as shown in FIG. 3A, the third electrode plate 230 and the drain electrode 113 of the first TFT 110 are provided in a same layer.

Figure 3B:
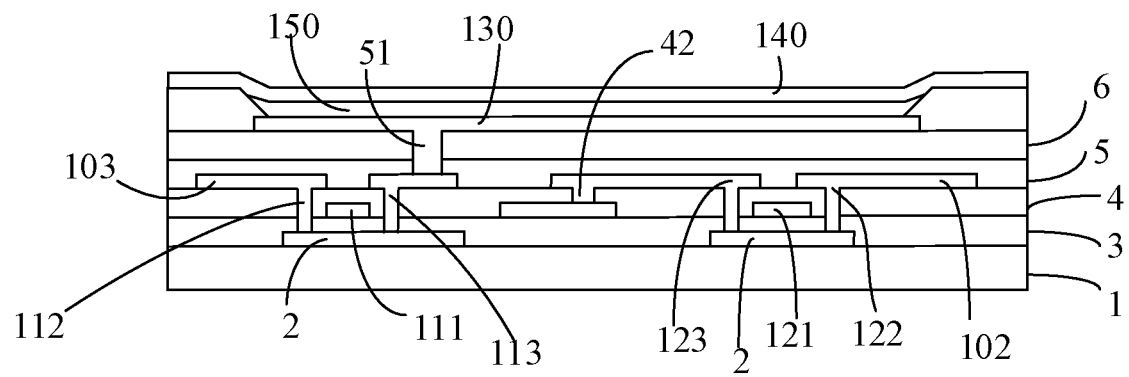
FIG. 3B is a sectional view of the array substrate taken along a line BB' in FIG. 2 provided by some embodiments.

In some embodiments, referring to FIGS. 2 and 3B, in a pixel unit 100, the source electrode 122 of the second TFT 120, the drain electrode 123 of the second TFT 120, the source electrode 112 of the first TFT 110 and the drain electrode 113 of the first TFT 110 are provided in a same layer, and the gate electrode 121 of the second TFT 120 and the gate electrode 111 of the first TFT 110 are provided in a same layer.

Figure 3C:
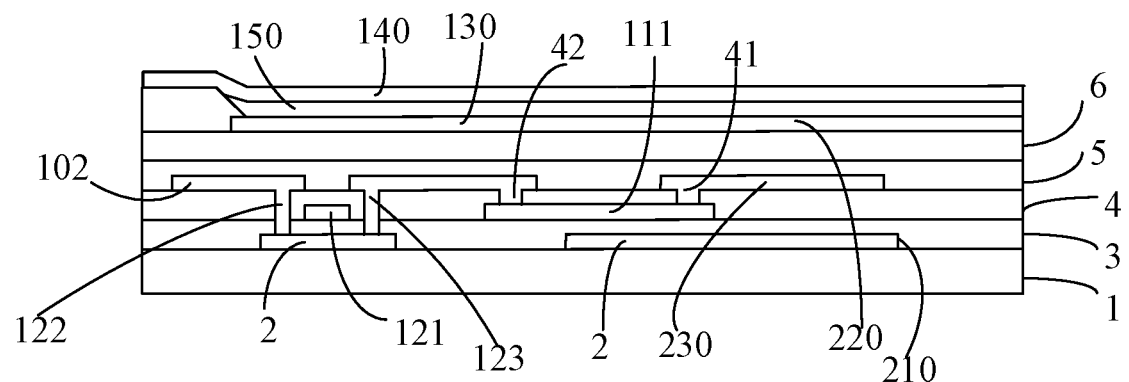
FIG. 3C is a sectional view of the array substrate taken along a line CC' in FIG. 2 provided by some embodiments.

In some embodiments, as shown in FIGS. 2 and 3C, if the storage capacitor includes the first electrode plate 210, the second electrode plate 220 and the third electrode plate 230, the third electrode plate 230 is electrically connected to the gate electrode 111 of the first TFT 110 through a second via hole 41 penetrating the interlayer insulation layer 4, and the drain electrode 123 of the second TFT 120 is electrically connected to the gate electrode 111 of the first TFT 110 through a third via hole 42 penetrating the interlayer insulation layer 4.

Referring to FIGS. 1, 2 and 3A, the third electrode plate 230 is connected to the gate electrode 111 of the first TFT 110, forming one electrode plate C1 of the storage capacitor; meanwhile, the first electrode plate 210 and the second electrode plate 220 electrically connected with each other are connected to the pixel electrode 130, forming the other electrode plate C2 of the storage capacitor. Thus, the capacitor including three electrode plates is connected to other components in the pixel unit.

In some embodiments, the first electrode plate of the storage capacitor is integrated with the active layer; thus, during the manufacturing of the array substrate, after the active layer is prepared using a semiconductor, a part of the active layer is ionized to complete the preparation of the first electrode plate. The second electrode of the storage capacitor is integrated with the pixel electrode; thus, by preparing the pixel electrode, the second electrode plate is also prepared.

In some embodiments, since the third electrode plate and the drain electrode of the first TFT are provided in the same layer, the third electrode plate is also prepared by manufacturing the drain electrode of the first TFT.

Therefore, in the above embodiments, the manufacturing process of the three electrode plates of the storage capacitor is simple and convenient, and does not increase complicated manufacturing processes.

In some embodiments, as shown in FIG. 3A, the pixel electrode 130 is provided on a planarization layer 6, and the first via hole 51 also penetrates the planarization layer 6.

In some embodiments, the gate electrode of the first TFT 110, the source electrode of the first TFT 110, the drain electrode of the first TFT 110, the gate electrode of the second TFT 120, the source electrode of the second TFT 120, the drain electrode of the second TFT 120 are made of one or at least two of the metal materials Cu, Al, Mo, T1, Cr and W.

In some embodiments, the gate electrode of the first TFT 110, the source electrode of the first TFT 110, the drain electrode of the first TFT 110, the gate electrode of the second TFT 120, the source electrode of the second TFT 120, the drain electrode of the second TFT 120 each have a single-layer structure.

In some embodiments, the gate electrode of the first TFT 110, the source electrode of the first TFT 110, the drain electrode of the first TFT 110, the gate electrode of the second TFT 120, the source electrode of the second TFT 120, the drain electrode of the second TFT 120 each have a multilayer structure including at least two layers.

In some embodiments, the gate insulation layer 3 is made of silicon nitride or silicon oxide.

In some embodiments, the gate insulation layer 3 has a single-layer structure.

In some embodiments, the gate insulation layer 3 has a multilayer structure including at least two layers. For example, the gate electrode insulation layer includes a silicon oxide layer and a silicon nitride layer.

In some embodiments, the passivation layer 5 is made of silicon nitride or silicon oxide.

In some embodiments, the passivation layer 5 has a single-layer structure.

In some embodiments, the passivation layer 5 has a multilayer structure including at least two layers. For example, the passivation layer 5 includes a silicon oxide layer and a silicon nitride layer.

In some embodiments, as shown in FIG. 3A, an anode of the OLED, a cathode 140, and a light emitting layer 150 between the anode and the cathode 140 are provided on the array substrate in the OLED display. According to the above descriptions, the anode of the OLED is the above pixel electrode 130.

In some embodiments, referring to FIG. 3A, a light emitting layer 150 is provided at a side of each pixel unit on the array substrate of the OLED display panel, and the light emitting layer 150 is an organic light emitting layer.

In some embodiments, the anode of the OLED is made of indium tin oxide (ITO).

In some embodiments, the anode of the OLED has an ITO/Ag/ITO structure made of ITO and Ag.

In some embodiments, the cathode of the OLED is made of Al or Ag.

In some embodiments, the storage capacitor includes the first electrode plate 210, the second electrode plate 220 and the third electrode plate 230, a portion of at least one of the first electrode plate 210 and the second electrode plate 220 facing towards the third electrode plate is bent toward the third electrode plate 230.

Since the portion of at least one of the first electrode plate 210 and the second electrode plate 220 facing towards the third electrode plate is bent toward the third electrode plate 230, the distance between the third electrode plate and the bent electrode plate is reduced, and the capacitance value of the storage capacitor is increased.

Figure 4A:
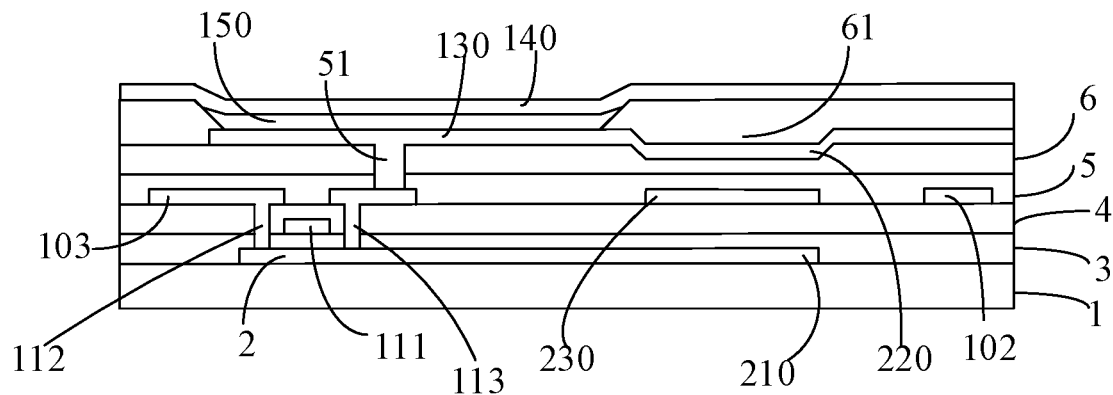
FIG. 4A is a sectional view of the array substrate taken along a line AA' in FIG. 2 provided by other embodiments.

FIG. 4A is a sectional view of the array substrate taken along the line AA' in FIG. 2 provided by other embodiments. Similar to the structure shown in FIG. 3A, in the structure of the array substrate shown in FIG. 4A, each pixel unit 100 includes the active layer 2, the gate insulation layer 3, the gate electrode 111 of the first TFT 110, the interlayer insulation layer 4, the source electrode 112 of the first TFT 110 (which is provided in a same layer as that of the drain electrode 113 of the first TFT 110), the passivation layer 5 and a pixel electrode 130 provided on the base substrate 1 in sequence. Each pixel unit 100 further includes the storage capacitor. Referring to FIGS. 2 and 4, the storage capacitor includes the first electrode plate 210, the second electrode plate 220 and the third electrode plate 230. The first electrode plate 210 is electrically connected to the second electrode plate 220, the third electrode plate 230 is disposed between the first electrode plate 210 and the second electrode plate 220, and the first electrode plate 210 and the second electrode plate 220 each have a portion facing towards the third electrode plate 230.

The array substrate shown in FIG. 4A is the same as the implemented structure of the array substrate shown in FIG. 3. The active layer 2 is integrated with the first electrode plate 210, the pixel electrode 130 is integrated with the second electrode plate 220, and the third electrode plate 230 is provided in a same layer as that of the drain electrode 113 of the first TFT 110.

On the basis of the above structure, as shown in FIG. 4A, a planarization layer 6 is further provided between the passivation layer 5 and the pixel electrode 130. A recess 61 is provided in a portion of the planarization layer 6 facing towards the third electrode plate 230, the second electrode plate 220 is deposited on the planarization layer 6, and the second electrode plate 220 forms a bending part at the recess 61.

Compared with the structure of the array substrate shown in FIG. 3A, the structure of the array substrate in FIG. 4A reduces the distance between the portions of the second and the third electrode plates 220 and 230 facing towards the third electrode plate 230, increasing the capacitance value of the storage capacitor.

Figure 4B:
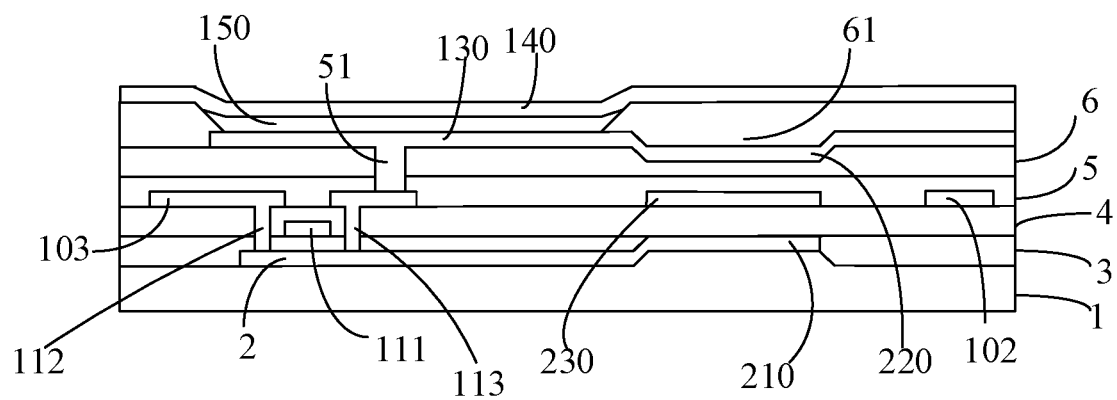
FIG. 4B is a sectional view of the array substrate taken along a line AA' in FIG. 2 provided by another embodiment.

In some embodiments, as shown in FIG. 4B, a protrusion is provided at a portion of the base substrate 1 facing towards the third electrode plate 230, causing the first electrode plate 210 to form a bending part at the protrusion when the first electrode plate is deposited on the substrate. Thus, compared with the structure of the array substrate shown in FIG. 3A, such structure reduces the distance between the portions of the second and the third electrode plates 220 and 230 facing towards the third electrode plate 230, increasing the capacitance value of the storage capacitor.

In the structure of the array substrate shown in FIG. 4A, the connection manners for the first TFT 110, the second TFT 120, the pixel electrode 130, the first electrode plate 210, the second electrode plate 220, and the third electrode plate 230 are the same as those of the above components in the array substrate shown in FIG. 3A.

The array substrate provided by the above embodiment is described by taking a storage capacitor including three electrode plates as an example.

In some embodiments, the number of the electrode plates included in the storage capacitor is greater than 3.

In some embodiments, in addition to the first, the second and the third electrode plates 210, 220 and 230 included in the storage capacitor in the above embodiment, the storage capacitor further includes a fourth electrode plate which is electrically connected to the first electrode plate 210, and is disposed between the first electrode plate 210 and the third electrode plate 230. The fourth electrode plate has a portion facing towards the third electrode plate 230.

In the above embodiment, by further providing the fourth electrode plate electrically connected to the first electrode plate 210 between the first electrode plate 210 and the third electrode plate 230, the distance between two opposite electrode plates is reduced, increasing the capacitance value of the storage capacitor.

In some embodiments, on the basis of the structure of the array substrate of the above embodiment, the storage capacitor further includes a fifth electrode plate which is disposed between the second electrode plate 220 and the third electrode plate 230, and is electrically connected to the second electrode plate 220, reducing the distance between the two opposite electrode plates, and increasing the capacitance value of the storage capacitor.

Figure 5:
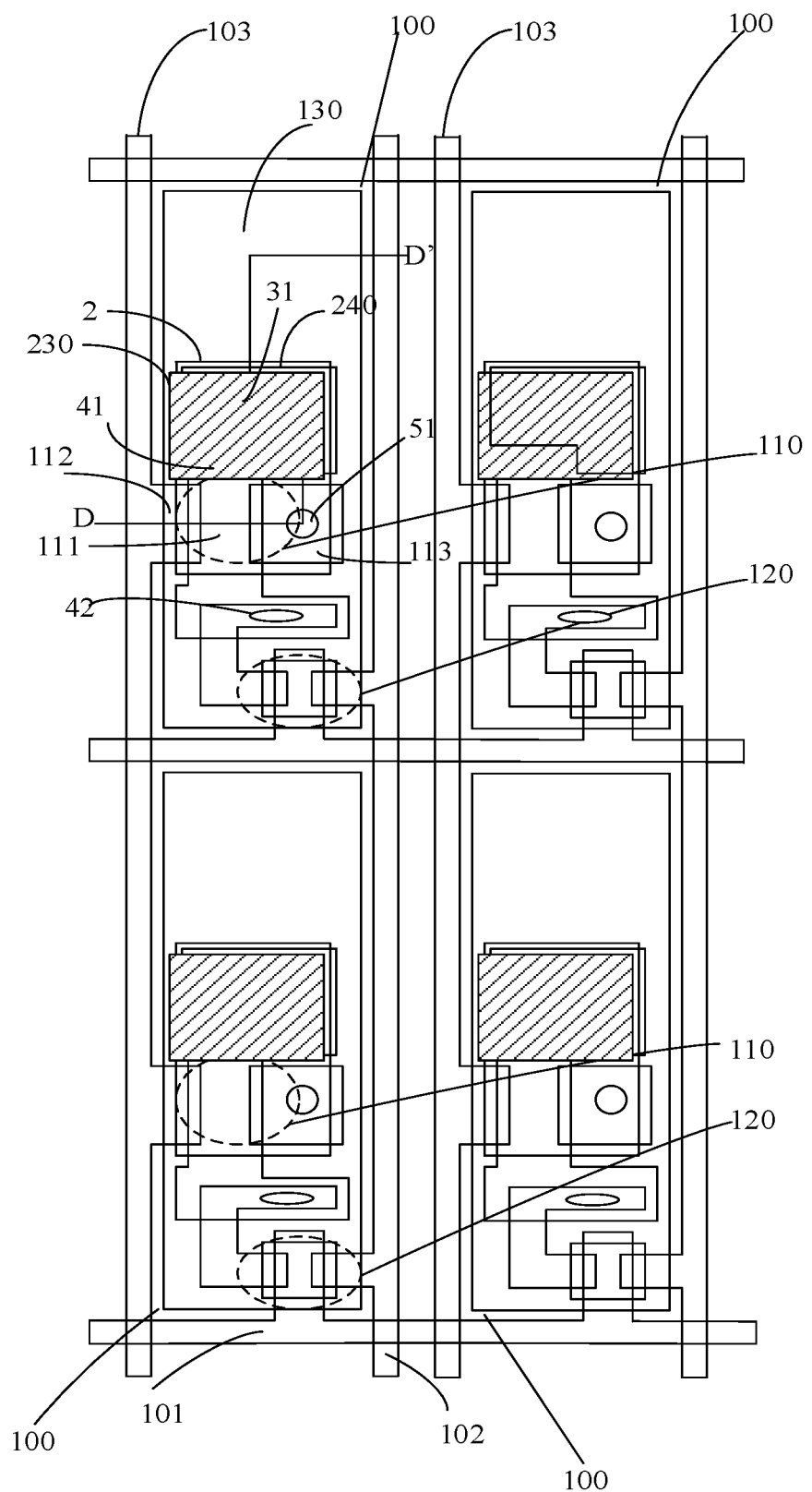
FIG. 5 is a schematic plan view of a structure of an array substrate provided by other embodiments.
Figure 6:
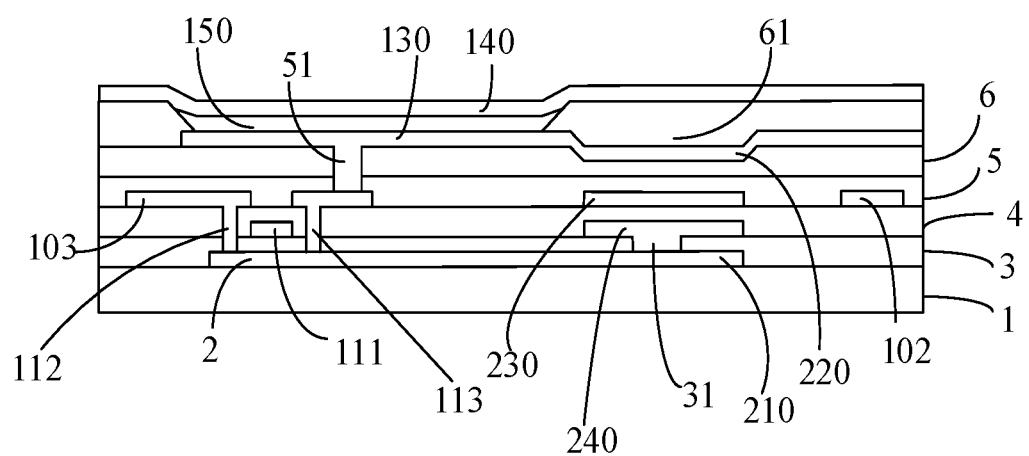
FIG. 6 is a sectional view of the array substrate taken along a line DD' in FIG. 5 provided by some embodiments.

In some embodiments, referring to FIGS. 5 and 6, the structure of the array substrate shown therein is the same as those in the above embodiments. The array substrate includes a plurality of pixel units 100, and each pixel unit 100 includes a first TFT 110, a second TFT 120, a pixel electrode 130 and a storage capacitor.

The array substrate further includes gate lines 101, data lines 102 and power source lines ($V_{dd}$) 103. A gate electrode of the second TFT 120 is connected to the gate line 101, a source electrode of the second TFT 120 is connected to the data line 102, and a drain electrode of the second TFT 120 is connected to the gate electrode of the first TFT 110. A source electrode of the first TFT 110 is connected to $V_{dd}$ 103, and a drain electrode of the first TFT 110 is connected to the pixel electrode 130.

Referring to FIG. 6, each pixel unit 100 including the above components in the array substrate is provided on a base substrate 1. Taking a partial cross section of the array substrate taken along the line DD' as an example, each pixel unit 100 includes in sequence an active layer 2, a gate insulation layer 3, the gate electrode 111 of the first TFT 110, an interlayer insulation layer 4, the source electrode 112 of the first TFT 110 (the drain electrode 113 of the first TFT 110 is provided in a same layer as that of the source electrode 112 of the first TFT 110), a passivation layer 5 and a pixel electrode 130 provided on the base substrate 1 on the base substrate 1.

Referring to FIG. 6, each pixel unit 100 further includes a storage capacitor. Referring to FIGS. 5 and 6, the storage capacitor includes a first electrode plate 210, a second electrode plate 220, a third electrode plate 230 and a fourth electrode plate 240. The first electrode plate 210, the second electrode plate 220, and the fourth electrode plate 240 are electrically connected to each other. The third electrode plate 230 is disposed between the fourth electrode plate 240 and the second electrode plate 220, and the first electrode plate 210, the second electrode plate 220 and the fourth electrode plate 240 each have a portion facing towards the third electrode plate 230.

In some embodiments, the active layer 2 is integrated with the first electrode plate 210, the pixel electrode 130 is integrated with the second electrode plate 220, the third electrode plate 230 is provided in a same layer as that of the drain electrode 113 of the first TFT 110, and the fourth electrode plate 240 is provided in a same layer as that of the gate electrode 111 of the first TFT 110.

In some embodiments, as shown in FIG. 6, a planarization layer 6 is further provided between the passivation layer 5 and the pixel electrode 130. A recess 61 is provided in a portion of the planarization layer 6 facing towards the third electrode plate 230, the second electrode plate 220 is deposited on the planarization layer 6, and the second electrode plate 220 forms a bending part at the recess 61.

In some embodiments, referring to FIGS. 5 and 6, the drain electrode 113 of the first TFT 110 is connected to the pixel electrode 130 through a first via hole 51 penetrating the passivation layer 5. The drain electrode 113 of the first TFT 110 is also connected to the active layer 2. The first electrode plate 210 is electrically connected to the second electrode plate 220. Furthermore, the fourth electrode plate is electrically connected to the first electrode plate 210 through a fourth via hole 31 penetrating the gate insulation layer 3. The first electrode plate 210, the second electrode plate 220 and the fourth electrode plate 240 are electrically connected to each other.

In some embodiments, in a pixel unit 100, the source electrode 122 of the second TFT 120, the drain electrode 123 of the second TFT 120, the source electrode 112 of the first TFT 110 and the drain electrode 113 of the first TFT 110 are provided in a same layer. The gate electrode 121 of the second TFT 120 and the gate electrode 111 of the first TFT 110 are provided in a same layer. The third electrode plate 230 is electrically connected to the gate electrode 111 of the first TFT 110 through a second via hole 41 penetrating the interlayer insulation layer 4, and the drain electrode 123 of the second TFT 120 is electrically connected to the gate electrode 111 of the first TFT 110 through a third via hole 42 penetrating the interlayer insulation layer 4.

In the structure of the above array substrate, as shown in FIGS. 1, 5 and 6, the third electrode plate 230 is connected to the gate electrode 111 of the first TFT 110, forming one electrode plate C1 of the storage capacitor; meanwhile, the first, the second and the third electrode plates 210, 220 and 240 electrically connected with each other are connected to the pixel electrode 130, forming the other electrode plate C2 of the storage capacitor. Thus, the capacitor including four electrode plates is connected to other components in the pixel unit.

In the embodiment shown in FIGS. 5 and 6, by bending the portion of the second electrode plate 220 facing towards the third electrode plate 230 to a direction of the third electrode plate, and providing the fourth electrode plate between the third electrode plate 230 and the first electrode plate 210, the distance between the multiple electrode plates is reduced and the capacitance value of the storage capacitor is increased, compared with the array substrates in the embodiments shown in FIGS. 2 to 4.

The above embodiments are described by taking an array substrate in the OLED display panel.

In some embodiments, the array substrates in the above OLED display panel are applicable to a QLED display panel.

In some embodiments, the array substrate in the QLED includes an anode, a cathode, and a light emitting layer located between the anode and the cathode. When the array substrate in the OLED display panel is applied to the QLED display panel, the light emitting layer is provided at a side of each pixel unit, the light emitting layer is a quantum dot light emitting layer, and the pixel electrode is the anode.

Some embodiments provide a display panel which includes the array substrate in any of the above embodiments.

Some embodiments provide a display device which includes the above display panel.

Compared with a solution that improves the stability of the display image by increasing the facing area of two electrodes in a storage capacitor having only the two electrodes, the array substrates, the display panel and the display device in the above embodiments increase the entire capacitance value of the storage capacitor by increasing the number of the electrode plates of the capacitor and reducing the distance between the electrode plates without increasing the area occupied by the storage capacitor.

What is claimed is:

1. An array substrate comprising a plurality of pixel units, wherein each pixel unit comprises a storage capacitor comprising at least three electrode plates parallel to each other, the at least three electrode plates parallel to each other comprise at least a first electrode plate, a second electrode plate and a third electrode plate, the first electrode plate is electrically connected to the second electrode plate, the third electrode plate is disposed between the first electrode plate and the second electrode plate, and the first electrode plate and the second electrode plate each have a portion facing towards the third electrode plate,
   wherein each pixel unit comprises in turn an active layer, a gate insulation layer, a gate electrode of a first thin film transistor (TFT), an interlayer insulation layer, a source electrode and a drain electrode of the first TFT which are disposed in a same layer, a passivation layer, and a pixel electrode on a base substrate,
   wherein the drain electrode of the first TFT is electrically connected to the pixel electrode through a first via hole penetrating the passivation layer; the active layer is integrated with the first electrode plate; and the pixel electrode is integrated with the second electrode plate, and
   wherein the third electrode plate is electrically connected to the gate electrode of the first TFT through a second via hole penetrating the interlayer insulation layer.

2. The array substrate according to claim 1, wherein the portion facing towards the third electrode plate of at least one of the first electrode plate and the second electrode is bent toward a direction of the third electrode plate.

3. The array substrate according to claim 1, wherein the at least three electrode plates parallel to each other further comprise a fourth electrode plate, the fourth electrode plate is electrically connected to the first electrode plate and is disposed between the first electrode plate and the third electrode plate, and the fourth electrode plate has a portion facing towards the third electrode plate.

4. The array substrate according to claim 1, wherein the third electrode plate and the drain electrode of the first TFT are disposed in a same layer.

5. The array substrate according to claim 1, further comprising a second TFT, a data line, and a gate line, wherein a source electrode of the second TFT is connected to the data line, a gate electrode of the second TFT is connected to the gate line, and the source electrode of the second TFT, a drain electrode of the second TFT, the source electrode of the first TFT, and the drain electrode of the first TFT are disposed in a same layer, the gate electrode of the second TFT and the gate electrode of the first TFT are disposed in a same layer; wherein the drain electrode of the second TFT is electrically connected to the gate electrode of the first TFT through a third via hole penetrating the interlayer insulation layer.

6. The array substrate according to claim 1, wherein the at least three electrode plates parallel to each other further comprise a fourth electrode plate which is electrically connected to the first electrode plate and has a portion facing towards the third electrode plate, the fourth electrode plate and the gate electrode of the first TFT are disposed in a same layer.

7. The array substrate according to claim 6, wherein the fourth electrode plate is electrically connected to the first electrode plate through a fourth via hole penetrating the gate insulation layer.

8. The array substrate according to claim 1, wherein a planarization layer is provided between the passivation layer and the pixel electrode, a recess is provided in a portion of the planarization layer facing towards the third electrode plate, the second electrode plate is deposited on the planarization layer and forms a bending part at the recess; and/or
   a protrusion is provided at a portion of the base substrate facing towards the third electrode plate, the first electrode plate is deposited on the substrate, and the first electrode plate forms a bending part at the protrusion.

9. The array substrate according to claim 1, further comprising an anode, a cathode, and a light emitting layer provided between the anode and the cathode, wherein the pixel electrode is the anode, the light emitting layer is disposed at a side of each pixel unit, and the light emitting layer is an organic light emitting layer or a quantum dot light emitting layer.

10. A display panel comprising the array substrate according to claim 1.

11. A display device comprising the display panel according to claim 10.

* * * * *